(12) United States Patent
Yang

(10) Patent No.: US 6,808,745 B2
(45) Date of Patent: Oct. 26, 2004

(54) METHOD OF COATING MICRO-ELECTROMECHANICAL DEVICES

(75) Inventor: Zhihao Yang, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 46 days.

(21) Appl. No.: 10/225,846

(22) Filed: Aug. 22, 2002

(65) Prior Publication Data

US 2004/0037956 A1 Feb. 26, 2004

(51) Int. Cl.[7] .............................................. C23C 16/00
(52) U.S. Cl. .............................. 427/248.1; 427/255.21; 427/255.6
(58) Field of Search ........................... 427/247.1, 255.6, 427/255.21

(56) References Cited

U.S. PATENT DOCUMENTS

| | | |
|---|---|---|
| 4,643,948 A | 2/1987 | Diaz et al. |
| 5,010,356 A | 4/1991 | Albinson |
| 5,598,193 A | 1/1997 | Halko et al. |
| 6,028,189 A * | 2/2000 | Blanchard ............... 536/25.3 |
| 6,345,881 B1 | 2/2002 | Yang et al. |
| 6,576,489 B2 * | 6/2003 | Leung et al. ............... 438/52 |
| 2002/0028451 A1 * | 3/2002 | Abbott et al. ............... 435/6 |

* cited by examiner

Primary Examiner—Timothy Meeks
(74) Attorney, Agent, or Firm—Kathleen Neuner Manne

(57) ABSTRACT

A method for coating a micro-electromechanical systems device with a silane coupling agent by a) mixing the silane coupling agent with a low volatile matrix material in a coating source material container; b) placing the micro-electromechanical systems device in a vacuum deposition chamber which in connection with the coating source material container; c) pumping the vacuum deposition chamber to a predetermined pressure; and maintaining the pressure of the vacuum deposition chamber for a period of time in order to chemically vapor deposit the silane coupling agent on the surface of the micro-electromechanical systems device.

20 Claims, 2 Drawing Sheets

METHOD OF COATING MICRO-ELECTROMECHANICAL DEVICES

FIELD OF THE INVENTION

This invention relates to a method for coating micro-electromechanical systems (MEMS) devices.

BACKGROUND OF THE INVENTION

Micro-Electro-Mechanical Systems (MEMS) is the integration of mechanical elements, sensors, actuators, and electronics on a common silicon substrate through the utilization of microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices on size scale of from 1 to 1000 microns. Examples of MEMS devices include airbag accelerometers (F. Goodenough, Electronic Design 8, 45 (1991)), gyros (R. T. Howe, B. E. Boser, and A. P. Pisano, Sens. Acturators A 56, 167 (1996)), optical switches, movable diffraction gratings (U.S. Pat. No. 6,233,087), and inkjet printheads (U.S. Pat. No. 6,079,821).

Due to the physical nature of the miniature structural members, such as the large surface-to-volume ratio and small offset from adjacent surfaces, MEMS devices are especially vulnerable to adhesion upon contact. Therefore, the "stiction" problem remains a major limitation in bringing new MEMS devices to the broader market (M. P. de Boer, T. A. Michalske, J. Applied Physics, 86, 817 (1999)). It is found that coatings reducing the surface energy of the miniature structural members, particularly those based silane coupling agents, have shown some promise for reducing stiction and improving MEMS performance (R. Maboudian, R. T. Howe, J. Vac. Sci. Tech. B, 15, 1 (1997)). However, the processes of applying silane coupling coating agents are generally involving with some liquid solvents (E. P. Pleuddemann, Silane Coupling Agents, Plenum Press, New York, 1982). Those "wet" processes are generally not desirable for MEMS fabrication as they cause problems in structure releasing. On the other hand, due to the high volatility, low flashpoint, and high instability (causing self-polymerization) of most silane coupling agents, a well controlled direct chemical vapor deposition process which results in repeatable uniform coatings is very difficult to achieve.

Another important class of MEMS are microfluidic devices, such an inkjet drop ejector. In the many of the microfluidic MEMS applications, coatings that control the surface wetting properties are especially important. U.S. Pat. Nos. 4,343,013; 4,555,062; and 4,623,906 and European Patents 117,316; 92,229; and 121,623 disclose the applications of anti-wetting coatings on the nozzle plates of inkjet printheads.

A MEMS inkjet drop ejector or printhead is formed out of silicon wafers using orientation-dependent etching techniques to create an array of nozzles on the orifice plate. With modern MEMS technology, various thermal and logic transducer components, known as heaters and logic control drivers, can be integrated onto the nozzle plates with designed microstructures located around nozzle orifices. The top surface of such fabricated printheads is composed of silicon oxide which may additionally be coated with a passivation layer of a metallic oxide such as tantalum oxide or a metallic nitride such as silicon nitride.

U.S. Pat. No. 5,598,193 discloses a treatment of the outer surface of a gold-plated nozzle plate with thiols, disulfides, or sulfinates to form a monolayer coating chemically bonded to the gold surface. U.S. Pat. Nos. 4,643,948 and 5,010,356 disclose coating methods of coating partly fluorinated alkyl silanes on the surfaces of inkjet printheads. It is disclosed by U.S. Pat. No. 6,345,881 to Yang et al. that a stamp or pad may be used to apply the coating to the nozzle plate. However, there is a problem with these methods in that they employ solvents that cause a capillary force induced stiction, or autoadhesion. In addition, those silanes often self-polymerize in solvents resulting in non-uniform coatings with large aggregates and particles that adversely affect the performances for the printheads.

SUMMARY OF THE INVENTION

An object of this invention is to provide an improved method for coating the surfaces of a MEMS device with a silane coupling agent in order to reduce autoadhesion. This and other objects are achieved in accordance with the present invention that comprises a method for coating a micro-electromechanical systems device with a silane coupling agent by a) mixing the silane coupling agent with a low volatile matrix material in a coating source material container;

b) placing the micro-electromechanical systems device in a vacuum deposition chamber that in connection with the coating source material container;

c) pumping the vacuum deposition chamber to a predetermined pressure; and maintaining the pressure of the vacuum deposition chamber for a period of time in order to chemically vapor deposit the silane coupling agent on the surface of the micro-electromechanical systems device By use of the invention, coatings of MEMS devices are achieved by a well controlled process, and the coatings applied by the method of the invention are very uniform, free of defects, aggregates, and particle contamination. In addition, anti-stiction coatings are effectively achieved on the actuating MEMS devices, and the anti-wetting coating is also effectively applied to the surface of a MEMS inkjet drop ejector. Further, by use of the invention the coating agent mixed in the matrix materials evaporates much slower under vacuum, thus resulting in a more uniform self-assembled monolayer (SAM) coating.

DETAILED DESCRIPTION OF THE INVENTION

In preferred embodiment of the invention, the coating agent is an alkyl or fluoroalkyl silane compound and may be represented by the formula:

$R_n SiX_m$ wherein: each R independently represents a substituted or unsubstituted alkyl, aryl, fluoroalkyl or arylfluoroalkyl group having from about 2 to about 30 carbon atoms;

each X independently represents halogen such as chlorine, or an alkoxy group having from 1 to about 3 carbon atoms;

n and m are integers from 1 to 3, with the proviso that n+m=4.

Examples of such alkyl, aryl, fluoroalkyl or arylfluoroalkyl groups include the following: methyl, ethyl, propyl, butyl, octyl, decyl, dodecyl, octadecyl, triacontyl, phenyl, phenylethyl, 3-phenylpropyl, tolyl, 3,3,3-trifluoropropyl, (3-heptafluoroisopropoxy)propyl, tridecafluoro-1,1,2,2-tectrahydrooctyl, heptadecafluoro-1,1,2,2-tectrahydrodectyl, pentafluorophenyl, pentafluorophenylpropyl, etc.

The causes of strong stiction of MEMS devices can traced to the interfacial forces existing at the dimensions of the microstructures, including capillary, electrostatic, van der Waals and chemical forces. Generally, high energy surfaces are prone to stiction. A coating of a SAM from the silane compounds described above can effectively reduce the surface energy to below about 20 dyne/cm (N. Tilllman, A. Ulman, J. S. Schildkraut, and T. L. Penner, *J. Am. Chem. Soc.* 110, 6136 (1988), and J. Brzoska, I. B. Azouz, and F. Rondelez, Langmuir, 10, 4367 (1994)). However, all the coating methods disclosed above used a liquid solution of a silane compound that is in direct contact with the surface of substrate during the coating process. Those processes are not suitable for the surface coating on MEMS devices, as the capillary force induced by liquid drying promotes the autoadhesion, or stiction of micromechanical components of MEMS devices.

Figure 1:
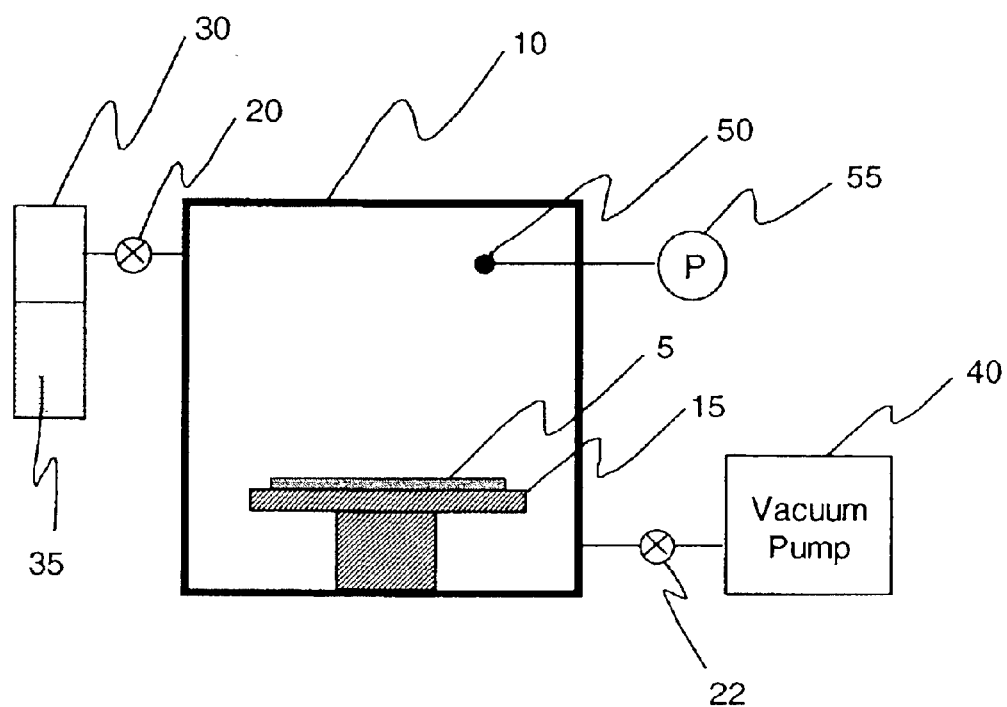
FIG. 1 illustrates the apparatus used in the coating method of the invention for coating a micro-electromechanical system.

It is a preferred embodiment of the invention to provide a method to coat the surfaces of a MEMS device with a SAM of an alkyl, aryl, fluoroalkyl or arylfluoroalkyl silane compound, without having any liquid materials in direct contact with the surfaces of the MEMS device. The process is depicted in FIG. 1 as follows: First, a coating source material 35 is formulated by dispensing the silane coupling agent in a low volatile matrix material, which serves as a absorbent of the silane coupling agent, in a coating source material container 30.

Second, the coating target of a MEMS device 5 is placed on the sample holding plate 15 in a vacuum deposition chamber 10 which is in connection with the coating source material container 30 controlled by a valve 20. The vacuum deposition chamber 10, which is equipped with a pressure measuring probe 50 and a pressure read-out device 55, is also in connection with a vacuum pump 40 controlled by another valve 22. Then, the vacuum deposition chamber 10 is pumped to a predetermined pressure, and the pressure is maintained in the vacuum deposition chamber for a period of time in order to chemically vapor deposit (CVD) the silane coupling agent on the surface of the MEMS device.

It is desirable that the valve 20 be turned off to stop the supply of coating source material, and the vacuum chamber is continuously pumped to a much lower vacuum for a period of time to remove any non-chemically bonded molecules from the surface.

Figure 2:
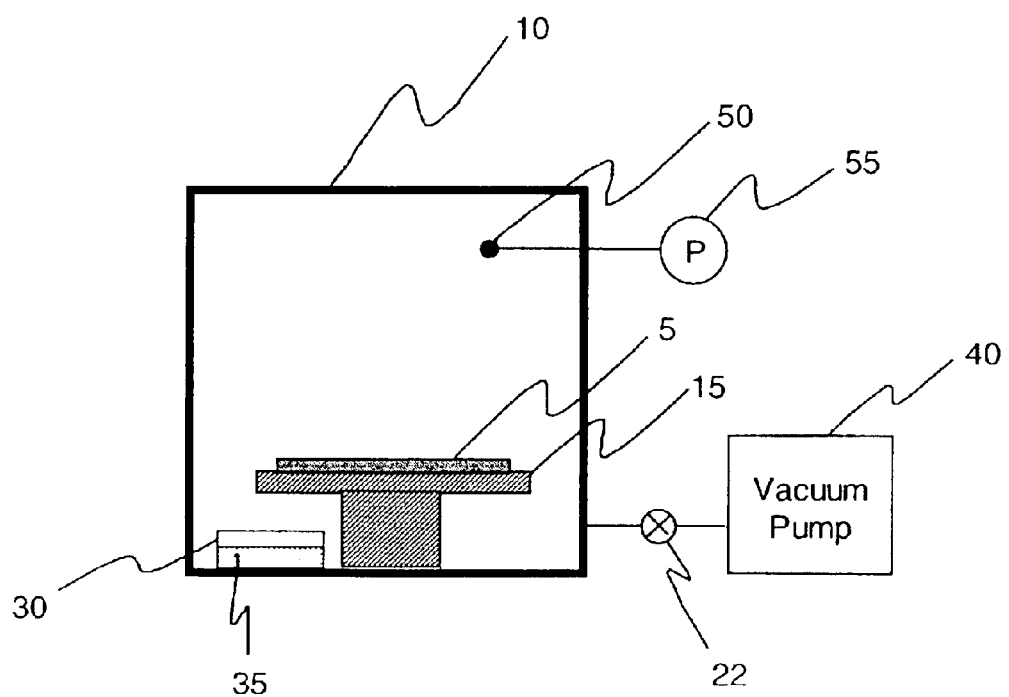
FIG. 2 illustrates another apparatus used in the coating method of the invention.

Another preferred embodiment of the invention is shown in FIG. 2. In that embodiment, the coating source material 35, which is formulated by dispensing the silane coupling agent in a low volatile matrix material in the coating source material container 30, is directly placed inside the chemical vacuum deposition chamber 10.

Examples of a low volatile matrix material that can be used in the invention include low volatile liquids such as a mineral oil and a silicon oil, or a solid material such as a wax or a zeolite or a sol-gel absorbent material.

MEMS devices used in a preferred embodiment of the invention, are fabricated from silicon-based materials. In these devices, structural members are fabricated using successively patterned depositions of thin film polycrystalline silicon (polysilicon) and sacrificial oxide layers, and the sacrificial oxide layers are selectively etched away in the structure release step. Polysilicon surfaces normally have a thin surface oxide film after completion of conventional micromachining process, which results in a hydrophilic surface with high surface energy. For various propose, the device surfaces are often passivated with another metallic oxide or metallic nitride, such as silicon nitride. In a preferred embodiment of the invention, the coating agent chemically bonds to the surface of the metallic oxide or metallic nitride. In yet another preferred embodiment of the invention, the metallic oxide is silicon oxide and the metallic nitride is silicon nitride.

A nozzle plate for a conventional ink jet printhead preferably comprises a silicon wafer constructed by conventional etching techniques which has a metallic oxide or nitride coating. It should be appreciated that other materials beside silicon wafer, such as electro-formed nickel, may be used to form the underlying nozzle plate as is known in the art. Further other metals such as silver, palladium and copper may be used to coat the underlying nozzle plate material. The plate includes an array of orifices through which ink is ejected. In yet another preferred embodiment of the invention, the metallic oxide is silicon oxide and the metallic nitride is silicon nitride.

The wetting character of surface of the ink jet nozzle plate is conventionally defined by the size of the contact angle between an ink drop and the test surface. Contact angles are conventionally measured by placing a 1–2 mm diameter liquid drop on a test surface and measuring the angle between the liquid and solid using a contact angle goniometer. A surface is considered anti-wetting if the contact angle between the ink and the surface is approximately 90° or greater. While an anti-wetting coating on surface of nozzle plate to prevent ink-spread is desirable, the coatings at the nozzle rims and walls of the inside channels often cause instability of the ink stream and hence degrade the printing quality. However, conventional methods to form alkylsilane coatings on a printhead wafer surfaces including solution immersion, spin coating, chemical vapor deposition, and plasma deposition, generally lack the control to avoid the coating materials getting into the nozzle.

The printheads with the aforementioned coatings are found to exhibit significant improvement of anti-ink-droplet spread and a great increase in printing lifetime. In comparison with the printheads without coatings, the printheads coated in accordance with the present invention demonstrate a significant improvement in the stability and straightness of ink droplet ejection, easiness in jet start and stop, and necessity of maintenance.

The invention will be further illustrated by the following examples:

EXAMPLES

Example 1

Coatings of Silane-Coupling Agent on Silicon Wafer Surface 2 grams of a mineral oil was added into the coating source material container connecting to the vacuum chamber, and was pumped to a vacuum of 100 millitorr for 2 hours. Immediately thereafter, 0.1 gram of a silane coupling agent, heptadecafluoro-1,1,2,2-tetrahydrodecyl triethoxylsilane or perfluorodecyl-1H,1H,2H,2H-triethoxylsilane ($C_{10}F_{17}H_4Si(OCH_2CH_3)_3$, from Gelest Inc.) was mixed into the mineral oil. Two kinds of silicon wafers, one with a silicon oxide surface and the other silicon nitride, were used to simulate the surface material of a MEMS device. Both wafers were treated with an oxygen plasma cleaning process prior to coating. The wafer samples were placed in the vacuum chamber, which was then pumped to a pressure of 100–200 millitorr and kept in that pressure range for about 1 hour. After disconnecting the coating source material container from the vacuum chamber, it was kept pumping to the pressure of 10–50 millitorr for about 1 hour. Then, the vacuum chamber was released to the ambient conditions for taking the sample out.

The effectiveness of the coating on each of the substrates was evaluated using ellipsometry and contact angles with water and ink (Kodak Professional Black Ink). The ellipsometric measurements showed that coating thickness across entire wafer was 16±2 Å, demonstrating that it was a uniform SAM coating of perfluorodecylsilane (PFDS). If a coating has anti-wetting properties, then it will repel aqueous inks and therefore suppress contamination of a nozzle plate by an aqueous ink. Thus a coating with high anti-wetting properties is desirable.

The contact angles of water and inks on the coatings were measured with a contact angle goniometer. The following results were obtained:

TABLE 1

| Substrate Surface | Water Contact Angle (°) | | Ink Contact Angle (°) | |
|---|---|---|---|---|
| | Before Coating | After Coating | Before Coating | After Coating |
| Silicon Oxide | 10 | 110 | 2 | 67 |
| Silicon Nitride | 28 | 106 | 3 | 65 |

The above results show that application of coating agent using the chemical vapor deposition technique of the invention was effective in providing a high quality SAM coating of a silane coupling agent.

Example 2

Anti-Stiction Coatings on an Electro-Mechanical Grating Device

The surfaces of an electromechanical grating device described in U.S. Pat. No. 6,233,087 to G. A. Hawkins et al. were coated with a PFDS self-assembled monolayer by the process described in Example 1. The electro-mechanical grating device comprised a base having a surface, a channel formed above the base, and ribbon structure defining a plurality of spaced apart deformable ribbon elements spanning the channel. The deformable ribbon elements are tensile and have a reflective top surface and a conductive bottom surface opposing the base surface. The ribbon elements can be actuated by applying a bipolar voltage to the ribbons. Both the base surface and the bottom surface of the ribbon elements had insulating dielectric thin films of either silicon nitride or silicon dioxide, on which the PFDS SAM coatings were targeted.

The electromechanical grating devices treated with the PFDS SAM coating process of the invention showed significant improvement in reduction of ribbon stiction as compared to untreated devices and showed significant superior performance in reliability and durability.

Example 3

Anti-Ink-Wetting Coatings on Inkjet Printhead

The surfaces of the nozzle plates of an inkjet drop-ejecting device described in U.S. Pat. No. 6,079,821 to J. M. Chwalek et al were coated with a PFDS self-assembled monolayer by the process described in Example 1. The surface of the nozzle plates had a passivation layer of a thin film of either silicon dioxide or silicon nitride. After coating, the contact angles of the nozzle plates with water and inks (Kodak Professional Black Ink) were higher than 105° and 62°, respectively, showing the good anti-ink-wetting property. During the printing operation, the PFDS SAM coating printheads were found having significant performance improvements, as they were easier to start and left virtually no ink residue after the printing had stopped. Very little or no ink accumulations on the nozzle plates were found during the printing process, and therefore there was less need for nozzle plate cleaning and maintenance. The PFDS SAM coating printheads also showed improvements in jet straightness and long-term stability.

Although the invention has been described in detail with reference to certain preferred embodiments for the purpose of illustration, it is to be understood that variations and modifications can be made by those skilled in the art without departing from the spirit and scope of the invention.

What is claimed is:

1. A method for coating a micro-electromechanical systems device with a silane coupling agent by (a) mixing said silane coupling agent with a low volatile matrix material in a coating source material container;

(b) placing said micro-electromechanical systems device in a vacuum deposition chamber which is in connection with said coating source material container;

(c) pumping said vacuum deposition chamber to a predetermined pressure; and maintaining the pressure of said vacuum deposition chamber for a period of time in order to chemically vapor deposit said silane coupling agent on the surface of said micro-electromechanical systems device.

2. The method of claim 1 wherein said silane coupling agent has the following formula:

$$R_nSiX_m$$

wherein:

each R independently represents a substituted or unsubstituted alkyl, aryl, fluoroalkyl or arylfluoroalkyl group having from about 2 to about 30 carbon atoms;

each X independently represents halogen or an alkoxy group having from 1 to about 3 carbon atoms; and n and m are integers from 1 to 3, with the proviso that n+m=4.

3. The method of claim 2 wherein R is methyl, ethyl, propyl, butyl, octyl, decyl, dodecyl, octadecyl, triacontyl, phenyl, phenylethyl, 3-phenyipropyl, tolyl, 3,3,3-trifluoropropyl, (3-heptafluoroisopropoxy)propyl, tridecafluoro-1,1,2,2-tectrahydrooctyl, heptadecafluoro-1,1,2,2-tectrahydrodecyl, pentafluorophenyl, or pentafluorophenyipropyl.

4. The method of claim 2 wherein X is chloride, methoxyl, or ethoxyl.

5. The method of claim 1 wherein the surface of said micro-electromechanical device is a metallic oxide or a metallic nitride.

6. The method of claim 1 wherein the surface of said micro-electromechanical device is a silicon oxide or a silicon nitride.

7. The method of claim 1 wherein said silane coupling agent is heptadecafluoro-1,1,2,2-tetrahydrodecyl triethoxylsilane.

8. The method of claim 1 wherein said micro-electromechanical systems device is a micro-electromechanical grating device.

9. The method of claim 1 wherein said micro-electromechanical systems device is an ink jet drop ejecting device.

10. The method of claim 1 wherein said low volatile matrix material is a mineral oil.

11. A method for coating a micro-electromechanical systems device with a silane coupling agent by
(a) mixing said silane coupling agent with a low volatile matrix material in a coating source material container that is placed in a chemical vacuum deposition chamber;
(b) placing said micro-electromechanical systems device in said vacuum deposition chamber;
(c) pumping said vacuum deposition chamber to a predetermined pressure; and maintaining the pressure of said vacuum deposition chamber for a period of time in order to chemically vapor deposit said silane coupling agent on the surface of said micro-electromechanical systems device.

12. The method of claim 11 wherein said silane coupling agent has the following formula:

$$R_n SiX_m$$

wherein:
each R independently represents a substituted or unsubstituted alkyl, aryl, fluoroalkyl or arylfluoroalkyl group having from about 1 to about 30 carbon atoms;
each X independently represents halogen or an alkoxy group having from 1 to about 3 carbon atoms; and n and m are integers from 1 to 3, with the proviso that n+m=4.

13. The method of claim 12 wherein R is methyl, ethyl, propyl, butyl, octyl, decyl, dodecyl, octadecyl, triacontyl, phenyl, phenylethyl, 3-phenylpropyl, tolyl, 3,3,3-trifluoropropyl, (3-heptafluoroisopropoxy)propyl, tridecafluoro-1,1,2,2-tectrahydrooctyl, heptadecafluoro-1,1,2,2-tectrahydrodectyl, pentafluorophenyl, or pentafluorophenylpropyl.

14. The method of claim 12 wherein X is chloride, methoxyl, or ethoxyl.

15. The method of claim 11 wherein the surface of said micro-electromechanical device is a metallic oxide or a metallic nitride.

16. The method of claim 11 wherein the surface of said micro-electromechanical device is a silicon oxide or a silicon nitride.

17. The method of claim 11 wherein said silane coupling agent is heptadecafluoro-1,1,2,2-tetrahydrodecyl triethoxylsilane.

18. The method of claim 11 wherein said micro-electromechanical systems device is a micro-electromechanical grating device.

19. The method of claim 11 wherein said micro-electromechanical systems device is an ink jet drop injecting device.

20. The method of claim 11 wherein said low volatile matrix material is a mineral oil.

* * * * *